(12) United States Patent
Chu et al.

(10) Patent No.: US 7,510,904 B2
(45) Date of Patent: Mar. 31, 2009

(54) STRUCTURE FOR AND METHOD OF FABRICATING A HIGH-SPEED CMOS-COMPATIBLE GE-ON-INSULATOR PHOTODETECTOR

(75) Inventors: Jack O. Chu, Manhasset Hills, NY (US); Gabriel K. Dehlinger, Annenheim (AT); Alfred Grill, White Plains, NY (US); Steven J. Koester, Ossining, NY (US); Qiqing Ouyang, Yorktown Heights, NY (US); Jeremy D. Schaub, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 316 days.

(21) Appl. No.: 11/556,739

(22) Filed: Nov. 6, 2006

(65) Prior Publication Data

US 2008/0113467 A1 May 15, 2008

Related U.S. Application Data

(62) Division of application No. 10/785,894, filed on Feb. 24, 2004, now Pat. No. 7,138,697.

(51) Int. Cl.
*H01L 21/00* (2006.01)
(52) U.S. Cl. .................. 438/94; 438/481; 257/E21.093
(58) Field of Classification Search .................... 438/93, 438/94, 481; 257/E21.092, E21.093, E21.132
See application file for complete search history.

(56) References Cited

U.S. PATENT DOCUMENTS 4,300,152 A 11/1981 Lepselter 4,722,910 A 2/1988 Yasaitis
5,494,857 A 2/1996 Cooperman et al.

(Continued)

OTHER PUBLICATIONS

Oh, J. et al. "Interdigitated Ge p-i-n Photodetectors Fabricated on a Si Substrate Using Graded SiGe Buffer Layers." IEEE Journal of Quantum Electronics, Sep. 2002, vol. 38 No. 9.

(Continued)

*Primary Examiner*—Chandra Chaudhari
(74) *Attorney, Agent, or Firm*—Scully, Scott, Murphy & Presser, P.C.; Robert M. Trepp, Esq.

(57) ABSTRACT

The invention addresses the problem of creating a high-speed, high-efficiency photodetector that is compatible with Si CMOS technology. The structure consists of a Ge absorbing layer on a thin SOI substrate, and utilizes isolation regions, alternating n- and p-type contacts, and low-resistance surface electrodes. The device achieves high bandwidth by utilizing a buried insulating layer to isolate carriers generated in the underlying substrate, high quantum efficiency over a broad spectrum by utilizing a Ge absorbing layer, low voltage operation by utilizing thin a absorbing layer and narrow electrode spacings, and compatibility with CMOS devices by virtue of its planar structure and use of a group IV absorbing material. The method for fabricating the photodetector uses direct growth of Ge on thin SOI or an epitaxial oxide, and subsequent thermal annealing to achieve a high-quality absorbing layer. This method limits the amount of Si available for interdiffusion, thereby allowing the Ge layer to be annealed without causing substantial dilution of the Ge layer by the underlying Si.

14 Claims, 14 Drawing Sheets

U.S. PATENT DOCUMENTS

| | | |
|---|---|---|
| 5,525,828 A | 6/1996 | Bassous et al. |
| 5,736,435 A | 4/1998 | Venkatesan et al. |
| 6,177,289 B1 | 1/2001 | Crow et al. |
| 6,373,112 B1 * | 4/2002 | Murthy et al. ............... 257/407 |
| 6,451,702 B1 * | 9/2002 | Yang et al. .................. 438/706 |
| 6,635,110 B1 | 10/2003 | Luan et al. |
| 2002/0094663 A1 | 7/2002 | Kwon et al. |
| 2003/0102469 A1 | 6/2003 | Jones et al. |
| 2003/0141565 A1 | 7/2003 | Hirose et al. |

OTHER PUBLICATIONS

Jones, R. et al. "Fabrication and Modeling of Gigahertz Photodetectors in Heteroepitaxial Ge-on-Si Using a Graded Buffer Layer Deposited by Low Energy Plasma Enhanced CVD." IEDM, Dec. 2002, p. 793-796.

Wolf, "Silicon Processing for the VLSI Era, vol. 2: Process Integration," Lattice Press, 1990, p. 12-13.

* cited by examiner

_US 7,510,904 B2_

STRUCTURE FOR AND METHOD OF FABRICATING A HIGH-SPEED CMOS-COMPATIBLE GE-ON-INSULATOR PHOTODETECTOR

RELATED APPLICATIONS

This application is a divisional of U.S. application Ser. No. 10/785,894 filed Feb. 24, 2004.

FIELD OF THE INVENTION

The present invention relates to semiconductors and photodetectors and more particularly to germanium-on-insulator photodetectors and a method of fabricating the same.

DESCRIPTION OF THE PRIOR ART

In the semiconductor industry, there has been a problem with creating a high-speed, high-efficiency photodetector that is compatible with conventional Si complementary metal oxide semiconductor (CMOS) technology. As such, much research effort has been carried out in an attempt to solve this problem.

One solution is the lateral trench detector described, for example, by M. Yang, et al., IEEE Elect. Dev. Lett., vol. 23, p. 395 (2002) and U.S. Pat. No. 6,177,289 to Crow, et al. This detector uses deep trenches in Si to collect light absorbed deep in the substrate. Despite its ease of integration with CMOS, this device has problems achieving high speed because of RC delays due to its high capacitance, as well as limitations in its ability to collect carriers generated deeper than the trench depth. Innovations such as using a buried pn junction (Q. Ouyang, et al., Device Research Conference, (2003)) or a buried insulator layer (M. Yang, et al., IEDM Tech. Digest, p. 547, 2001) can improve the latter problem somewhat, though, due to the depth of the fingers (several microns), these innovations are not easy to integrate into a standard CMOS process.

Another solution is to build either a lateral or a vertical p-i-n detector on a relaxed Ge layer grown by grading the Ge content of SiGe from pure Si to pure Ge. See, for example, J. Oh, IEEE J. Quantum Electron., vol. 38, 1238 (2002), and S. B. Samavedam, et al., Appl. Phys. Lett., vol. 73, 2125 (1998). This technique has the advantage that Ge has much higher absorption than Si, particularly at 850 nm, and therefore deep trenches are not necessary, enabling low-capacitance detectors to be built. Ge also has higher electron and hole mobility than Si, enabling faster collection of photogenerated carriers. The graded buffer layer also allows low defect densities to be achieved in the final Ge layer. However, this technique has the problem that very thick layers (on the order of greater than 1 µm) are needed to reduce the dislocation density and also ensure that all the light is collected in the top Ge layer. This can lead to reduced bandwidth because carriers generated deep within the substrate have a longer distance to reach the electrodes. The thick layers also cause problems with integration because thick layers typically create a non-planar surface for processing.

Another solution that has been proposed is to build vertical or lateral p-i-n detectors using Ge grown directly on a Si substrate. See, for example, L. Colace, et al., IEEE J. Quantum Electron., vol. 35, 1843 (1999). This technique has the advantage that thick graded layers are not needed because the Ge is grown directly on bulk Si substrates. Therefore, for long-wavelengths ($\lambda > 1.1$ µm), the absorbing layer is restricted to the Ge layer allowing fast carrier collection. However, this technique has the problem that for shorter wavelength light (such as, for example, 850 nm), carriers are also generated in the underlying Si layer, greatly reducing the speed of the detector. Moreover, Ge grown directly on Si has a high defect density, and either selective-area growth or high-temperature annealing is needed to reduce the dislocation density. See, for example, H. S. Luan, et al., Appl. Phys. Lett, vol. 75, 2909 (1999), and U.S. Pat. No. 6,635,110 to Luan, et al. The annealing is especially problematic, because it can lead to significant Si diffusion into the Ge layer, which can greatly reduce the absorption. The interdiffusion is a particular problem for thin Ge layers, as the Si can diffuse throughout the entire Ge layer.

Yet another solution is to fabricate a resonant-cavity detector as described in J. D. Schaub, et al., IEEE Phot. Tech. Lett., vol. 11, 1647 (1999). This prior detector utilizes mirrors on the top and bottom of the absorbing region to enhance the responsivity while still achieving high speed. The absorbing material can still be Si in this case. However, this technique has the problem that it only has high absorption near the resonance wavelength, which can be a fairly narrow peak. Therefore, precise tuning of the incident wavelength and the cavity dimensions are needed. Also, fabrication of the bottom mirror and the lateral overgrowth epitaxy required to produce Si over this mirror is complicated.

The above problems could be solved by utilizing one aspect of the invention described in U.S. Pat. No. 5,525,828 to Bassous, et al. as part of a broader invention on Si and SiGe lateral p-i-n and MSM detectors. In the '828 patent, a p-i-n or MSM detector that utilizes an absorbing region consisting of Ge over a buried insulating layer is described. This is the basic structure needed for making a high-performance photodetector, because the Ge has an extremely-high absorption at 850 nm (~70× that of Si at the same wavelength), while the buried insulating layer blocks slow carriers generated in the Si substrate from being collected at the surface electrodes. However, the '828 patent does not describe a specific structure that could actually achieve high performance or be CMOS compatible, nor does it provide a method by which such a structure could be made.

SUMMARY OF THE INVENTION

The present invention provides a structure for a high-performance photodetector that includes a Ge absorbing layer on a thin SOI substrate, and utilizing alternating n- and p-type surface electrodes. By "high-performance" it is meant a photodetector that exhibits a −3 dB bandwidth greater than 15 GHz, and an external quantum efficiency greater than 15%.

Advantageously, the photodetectors of the present invention achieve: (a) high bandwidth by utilizing a buried insulating layer to isolate carriers generated in the underlying substrate, (b) high quantum efficiency over a broad spectrum by utilizing a Ge absorbing layer, (c) low voltage operation by utilizing an absorbing layer that is thin and narrow electrode spacings, and (d) compatibility with CMOS devices by virtue of its planar structure and use of a Group IV absorbing material. Examples of Group IV absorbing materials include C, Si, Ge, Sn, Pb and combinations thereof.

The present invention also provides a method for fabricating a high-performance photodetector using direct growth of Ge on a thin SOI layer, and subsequent thermal annealing to achieve a high-quality absorbing layer.

Advantageously, the method of the present invention limits the amount of Si available for interdiffusion, thereby allowing the Ge layer to be annealed without causing substantial dilution of the Ge layer by the underlying Si.

BRIEF DESCRIPTION OF THE DRAWINGS

Further features, aspects and advantages of the photodetector and method of the present invention will become better understood with regard to the following description, appended claims, and accompanying drawings where:

FIGS. 1(c)-1(e) are cross-sectional views of: FIG. 1(c) a one-sided lateral p-i-n Ge-on-insulator photodetector; FIG. 1(d) a symmetric metal-semiconductor-metal (MSM) Ge-on-insulator photodetector; FIG. 1(e) an asymmetric MSM Ge-on-insulator photodetector.

DETAILED DESCRIPTION OF THE INVENTION

Figure 1A:
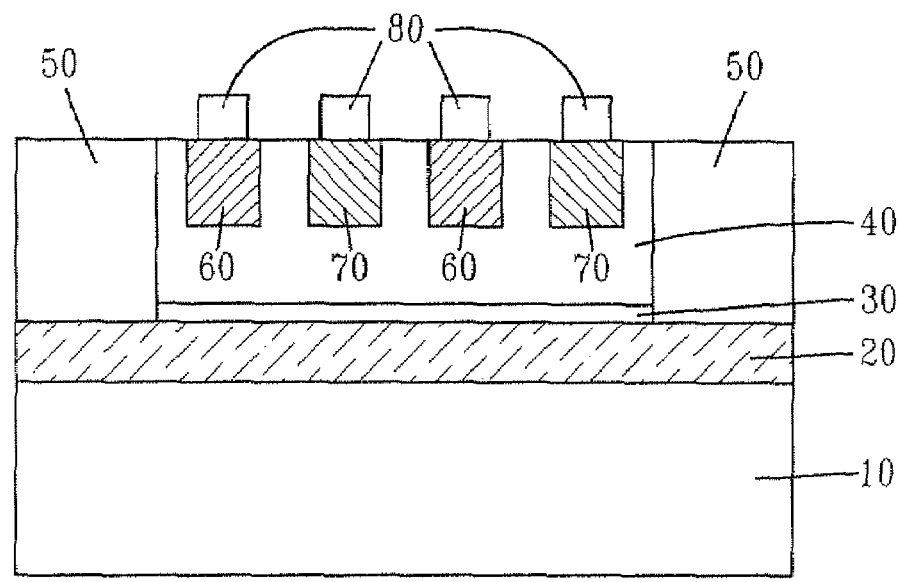
FIG. 1(a) is a cross-sectional view.
Figure 1B:
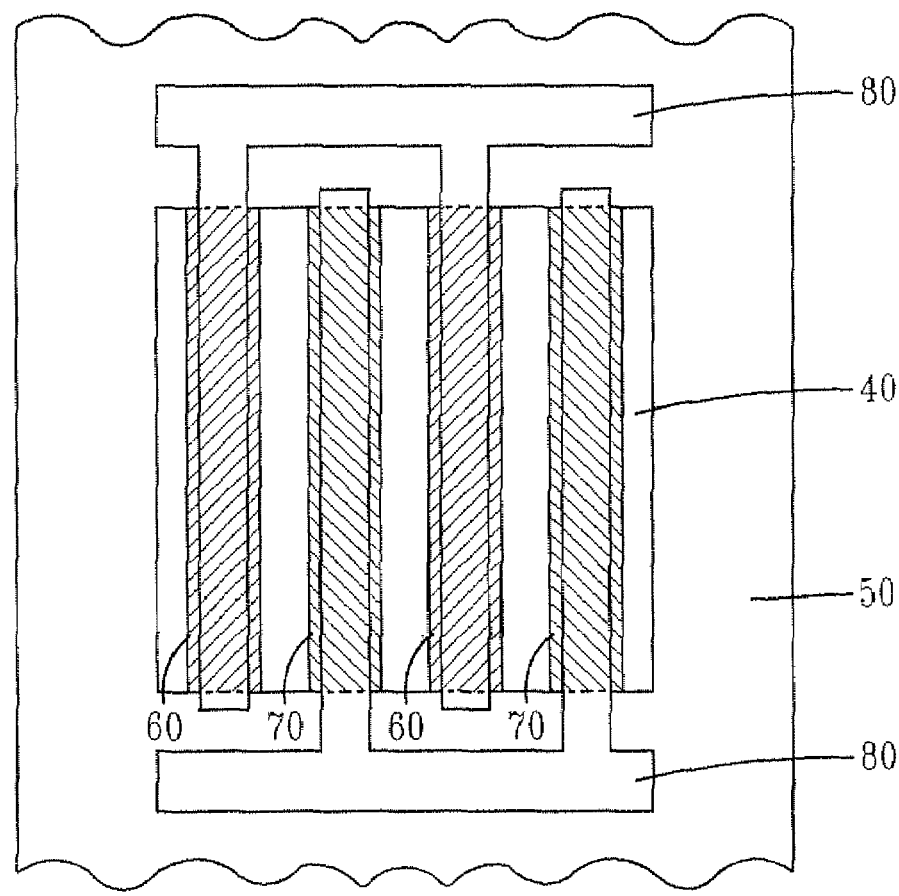
FIG. 1(b) is a plan view, which show one embodiment of the present invention, which consists of a structure for a high-speed lateral p-i-n Ge-on-insulator photodetector.

Cross-sectional and plan-view diagrams of one embodiment of the present invention are shown in FIGS. 1(a) and 1(b). As shown in FIG. 1(a), the present invention provides a Ge-on-insulator photodetector that is composed of a single-crystal semiconductor substrate 10 (e.g., Si, Ge, SiGe, GaAs, InAs, SiGeC or SiC), an insulating layer 20 (e.g., an oxide, nitride, oxynitride or any combination thereof), and a thin layer of essentially Si (hereinafter Si layer) 30 (e.g., an SOI layer, epi-Si, or amorphous Si). In a preferred embodiment of the present invention, the initial substrate is a Si-on-insulator (SOI) wafer, and therefore layer 10 is Si, and layer 20 is a buried oxide, e.g., $SiO_2$. On top of the thin Si layer 30, is a layer of essentially Ge (hereinafter Ge layer) 40 which, in accordance with the present invention, is much thicker than the Si layer 30. In a preferred embodiment of the present invention, layers 30 and 40 are not-intentionally doped, and should have as low a doping concentration as possible. The remainder of the photodetector consists of isolation regions 50, interdigitated p-type contact regions 60 and n-type contact regions 70, and surface electrodes 80. The plan-view diagram of FIG. 1(b) shows that the isolation regions 50 surround the entire active area of the device. Alternate surface electrodes are connected together away from the active area of the device over the isolation regions 50. In accordance with the present invention, the combined average Ge concentration of the Si layer and the Ge layer is greater than 80%.

The photodetector of the present invention works by shining near-infrared light normal to the top surface of layer 40. Electrons-hole pairs generated in the Ge layer 40 are collected by n- and p-type contacts 60 and 70, respectively. Electron-hole pairs generated below the insulating layer 20, that is, in the substrate 10, are isolated from the contacts, 60 and 70 and therefore simply recombine. The photodetector device of the present invention achieves high speed on the order of about 15 GHz or greater because light is only absorbed in layers 30 and 40 above the insulating layer 20, and so the absorbing region, i.e., layers 30 and 40, can be made very thin. The device also achieves high responsivity due to the short absorption length of infrared light in Ge (~0.25 μm at $\lambda$=850 nm, ~1 μm at $\lambda$=1300 nm). In a preferred embodiment of the present invention, the combined thickness, d, of Si layer 30 and Ge layer 40 should be no more than about 500 nm. Furthermore, the Ge layer 40 should have a minimum thickness of 50 nm in order to absorb sufficient light to make a useful detector.

The thin Ge absorbing layer 40 allows the contact regions 60 and 70 to be close together, enabling fast collection of the photogenerated carriers. In a preferred embodiment, the spacing, S, between p-type contact region 60 and n-type contact region 70 is in the range: d<S<2d, with typical values being between 0.1 and 1.0 μm. Generally, increased capacitance and higher surface reflection degrades performance when S is much less than d, while the long carrier transit time reduces the bandwidth when S is much greater than 2d. Excessive dark current can also result from d being too small. It is also desirable to make the surface electrodes 80 out of a metal, and as thick as possible to reduce series resistance.

Candidate materials for the electrodes include, but are not limited to Al, Cu, Ti, TiN, Pt, W, Ta, TaN, Pt, Pd, Hf; Indium tin oxide (ITO) and combinations or alloys thereof. The electrode material may also include silicides and/or germanides of the aforementioned metals. The combination of low capacitance due to the lateral geometry, low series resistance due to thick metal electrodes and short transit times, along with the high absorption coefficient of Ge, allow the photodetectors of the present invention to simultaneously achieve high speed and high responsivity.

Figure 1C:
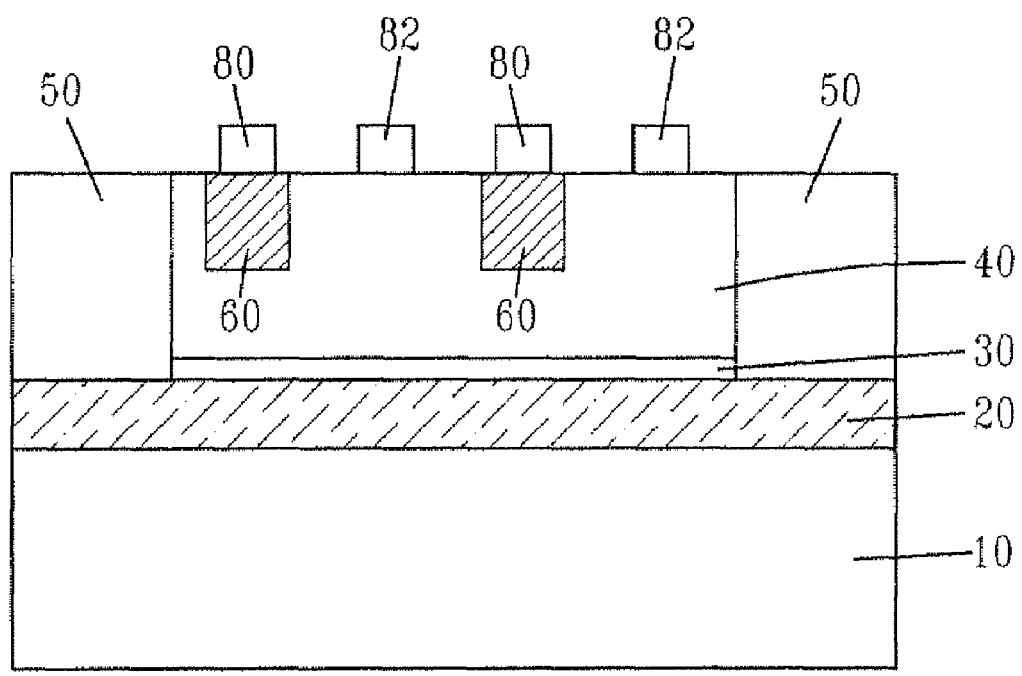
Figure 1D:
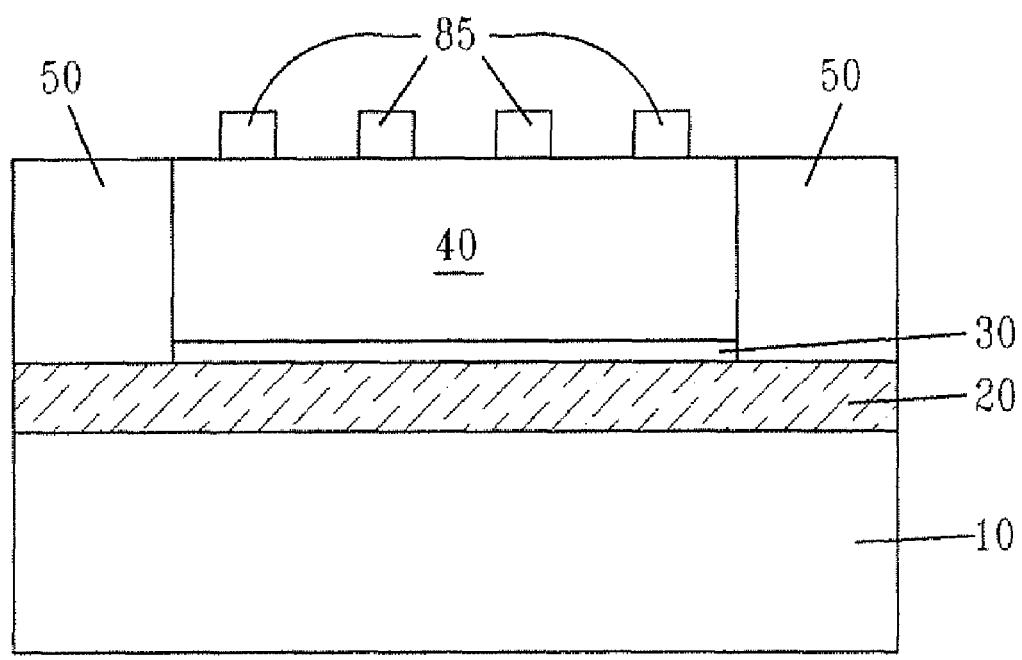
Figure 1E:
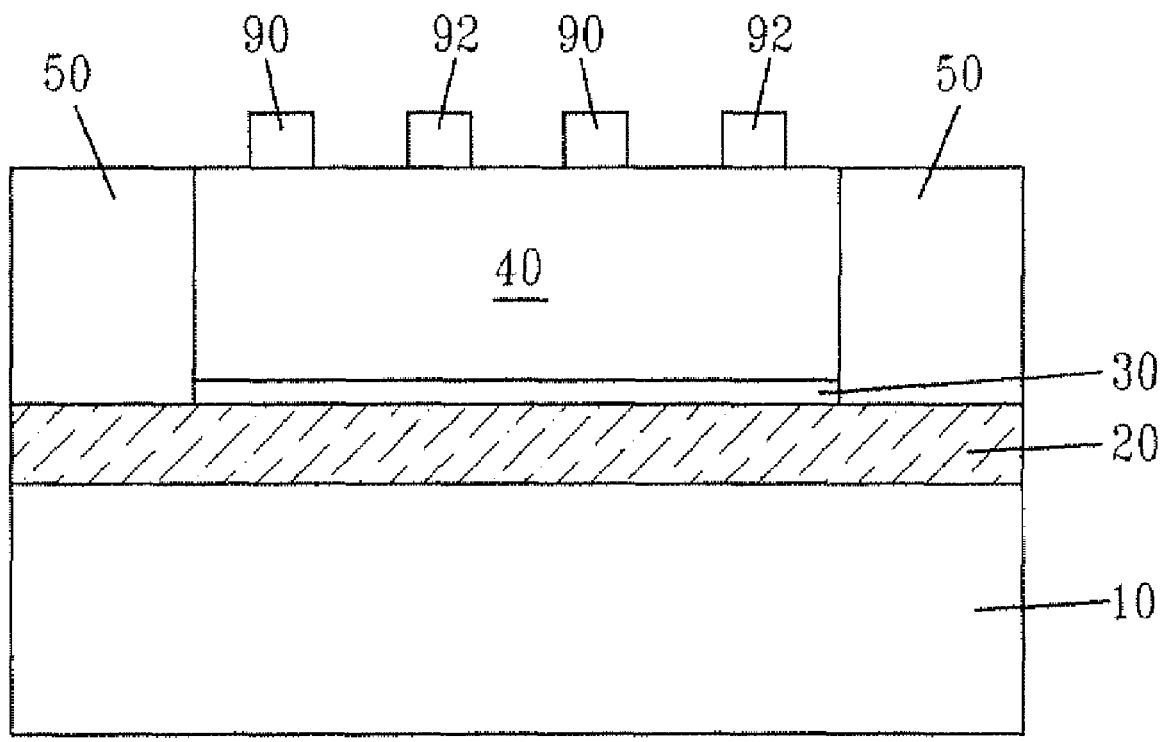

In another embodiment of the present invention, one or both of the implanted regions. may be eliminated. In particular, it is often convenient to eliminate the p-type implant, as many high work function metals have low barrier height to the valence band of Ge. By "low barrier height" it is meant that the difference between the electrode Fermi level and the Ge conduction or valence band is less than $E_g/2$ for the positive-biased or negative-biased electrode, respectively, where $E_g$ is the band gap of the Ge absorbing layer. This situation is shown in FIG. 1(c), where the electrode 82, previously above the p-type implant, now makes direct contact to Ge layer 40. In a preferred embodiment, electrode 82 has a low barrier height to the valence band of Ge layer 40 in order to minimize the dark current. In a similar way, a p-type implant could be utilized, and the n-type implant eliminated. In the case of both implants being eliminated, the detector essentially becomes a metal-semiconductor-metal (MSM) photodetector, where both sets of electrodes are in direct contact with the Ge absorbing layer. Though this configuration tends to have higher dark current than the lateral p-i-n geometry, the MSM geometry could have acceptably low dark current if operated at sufficiently low bias voltages. The MSM geometry could have electrodes with the same metal (symmetric configuration), as shown in FIG. 1(d), or utilize different materials for the positive and negative electrodes (asymmetric configuration) as shown in FIG. 1(e). In the symmetric configuration, electrodes 85 are in direct contact with the absorbing region 40, and preferably comprise a material with Fermi level near the mid-gap of Ge, in order to minimize dark current. The concept of using an asymmetric MSM photodetector to reduce dark current has already been demonstrated on III-Vs by W. A. Wohlmuth, et al., Appl. Phys. Lett., vol. 69, pg. 3578 (1996) and on bulk Ge by C. O. Chui, et al., in IEEE Phot.

Tech. Lett., vol. 15, p. 1585 (2003). In this configuration, the positive-biased electrodes 90 and negative-biased electrodes 92 have barrier heights to the conduction and valence bands, respectively, that are less than $E_g/2$, and preferably as low as possible.

The multi-layer structure design shown in FIG. 1(a) can also be optimized to take advantage of the optical interference between the surfaces of the insulating layer 20. A peak in the light intensity reflected from these interfaces occurs when the following relation is satisfied:

$$t_2 = 0.5(i+0.5)(\lambda/n_2)$$

where i is an integer, $\lambda$ is the wavelength of the incident light in vacuum, $t_2$ is the thickness of the insulating layer 20, and $n_2$ is the refractive index of the insulating layer 20. In the case where the buried oxide has a thickness at or near the condition for peak reflection, the thicknesses, $t_3$, of the Si layer 30 and the thickness, $t_4$, of the Ge layer 40 can also be adjusted to achieve peak absorption. In this case, the peak absorption condition occurs when $$t_3 n_3 + t_4 n_4 = (i+1)(\lambda/2),$$

where i is an integer and $\lambda$ is the wavelength of the incident light in vacuum, and $n_3$ and $n_4$ are the refractive indexes of the Si layer 30 and the Ge layer 40, respectively. However, due to the strong absorption of infrared radiation by Ge, adequate response can still be achieved even in off-resonance conditions, and so the above conditions provide a means to optimize the device performance, but are not a strict requirement. In one embodiment of the present invention, the insulating layer has a thickness, $t_2$, and refractive index, $n_2$, such that the following relation is obeyed:

$$0.5(i+0.4)(\lambda/n_2) < t_2 < 0.5(i+0.6)(\lambda/n_2),$$

where i is an integer, and $\lambda$ is the wavelength of the incident light in vacuum. In yet another embodiment of the present invention the Si layer has thickness, $t_3$, and refractive index, $n_3$, and the Ge layer has thickness, $t_4$, and refractive index $n_4$, such that the following relation is obeyed:

$$(i+0.9)(\lambda/2) < t_3 n_3 + t_4 n_4 < (i+1.1)(\lambda/2),$$

where i is an integer and $\lambda$ is the wavelength of the incident light in vacuum.

Further constraints on the layer structure design are imposed if the material is subjected to high-temperature annealing. By "high-temperature", it is meant an annealing temperature greater than about 750° C. Annealing is used to reduce the dislocation density of the as-grown material, and is also necessary as part of the fabrication process in order to activate the n- and p-type implants that are used in forming contact regions 60 and 70, respectively. In this case, the device structure is described by FIG. 2(a), which comprises a single-crystal semiconductor substrate 110, an insulating layer 120, a Si layer 130, an interdiffused $Si_{1-x}Ge_x$ layer 140, and a Ge layer 150. The interdiffused $Si_{1-x}Ge_x$ layer 140 has a Ge concentration, x, that continuously varies between 0 adjacent to the Si layer 130 and 1 adjacent to the Ge layer 150. The structure shown in FIG. 2(a) also includes alternating contact regions 60 and 70, electrodes 80 and isolation regions 50.

In the limiting case of very high temperature annealing, as may be used after initial growth of the Ge layer (see, for example, U.S. Pat. No. 6,635,110 to Luan, et al.), sufficient interdiffusion occurs such than the entire region above the insulating layer 120 consists of a compositionally-graded $Si_{1-x}Ge_x$ layer 160, as is shown in FIG. 2(b), with a Ge concentration, x, that has a minimum adjacent to the insulating layer 120 and maximum at the top surface of the $Si_{1-x}Ge_x$ layer 160. The structure shown in FIG. 2(b) also includes alternating contact regions 60 and 70, electrodes 80 and isolation regions 50. It is under these conditions, that the merits of the present invention are considerable, as the buried insulator limits the Si available for interdiffusion to the original Si layer. Therefore, for the embodiment shown in FIG. 2(b), the original Si and Ge layer thicknesses should be such that the average Ge concentration of the entire layer structure above the buried insulator 120 is greater than approximately 0.8, and as close to 1 as possible. In order to obey this guideline, the original Ge layer should be at least 5 times the original thickness of original Si layer. For instance, if the initial Si layer is 50 nm, then the Ge layer should be no less than 250 nm.

Figure 2A:
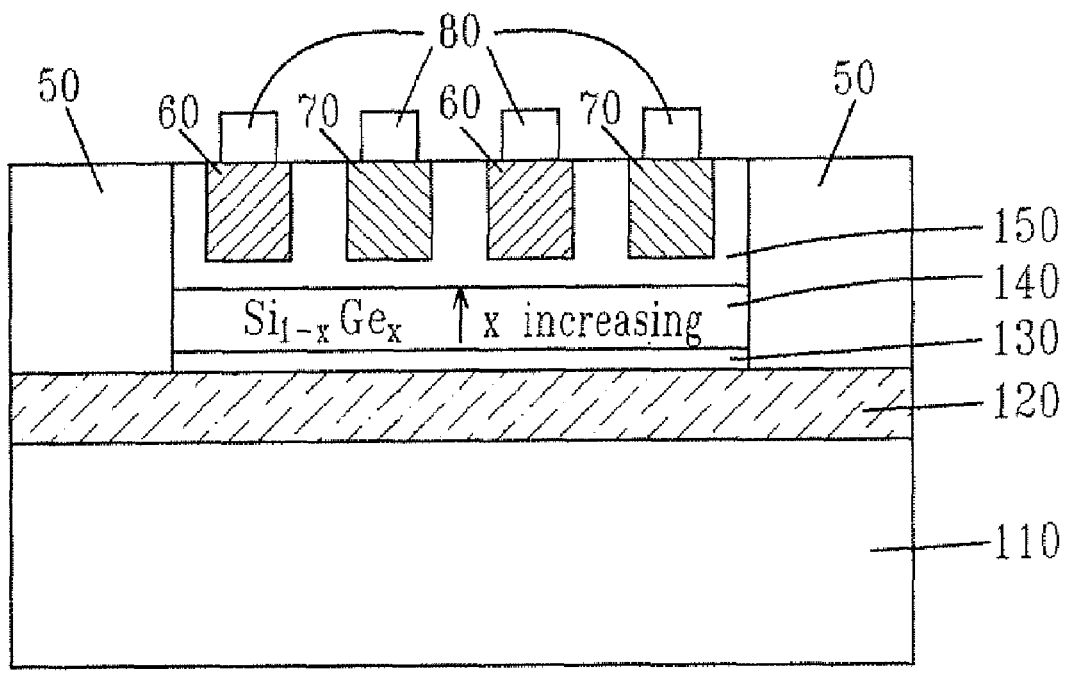
FIG. 2(a) shows a cross-sectional diagram of the device in FIG. 1(a) including a compositionally-graded $Si_{1-x}Ge_x$ layer between the Si and Ge layers formed by annealing and subsequent interdiffusion.
Figure 2B:
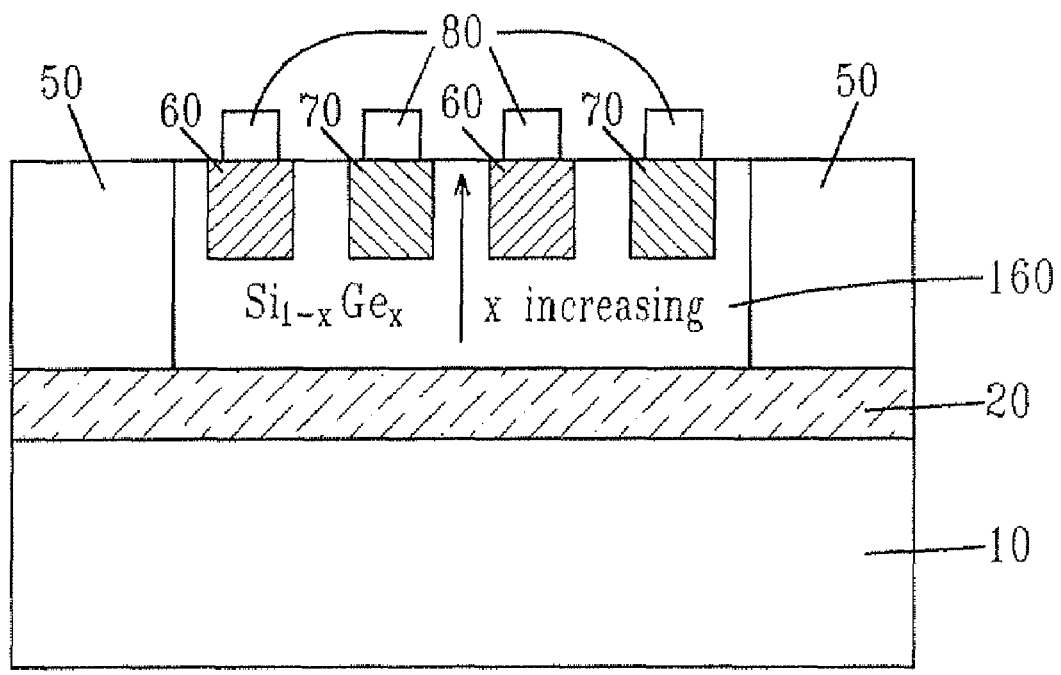
FIG. 2(b) shows the same device as in 2(a) where annealing has caused sufficient interdiffusion such that the entire region above the buried insulating layer consists of a compositionally-graded $Si_{1-x}Ge_x$ layer.
Figure 3A:
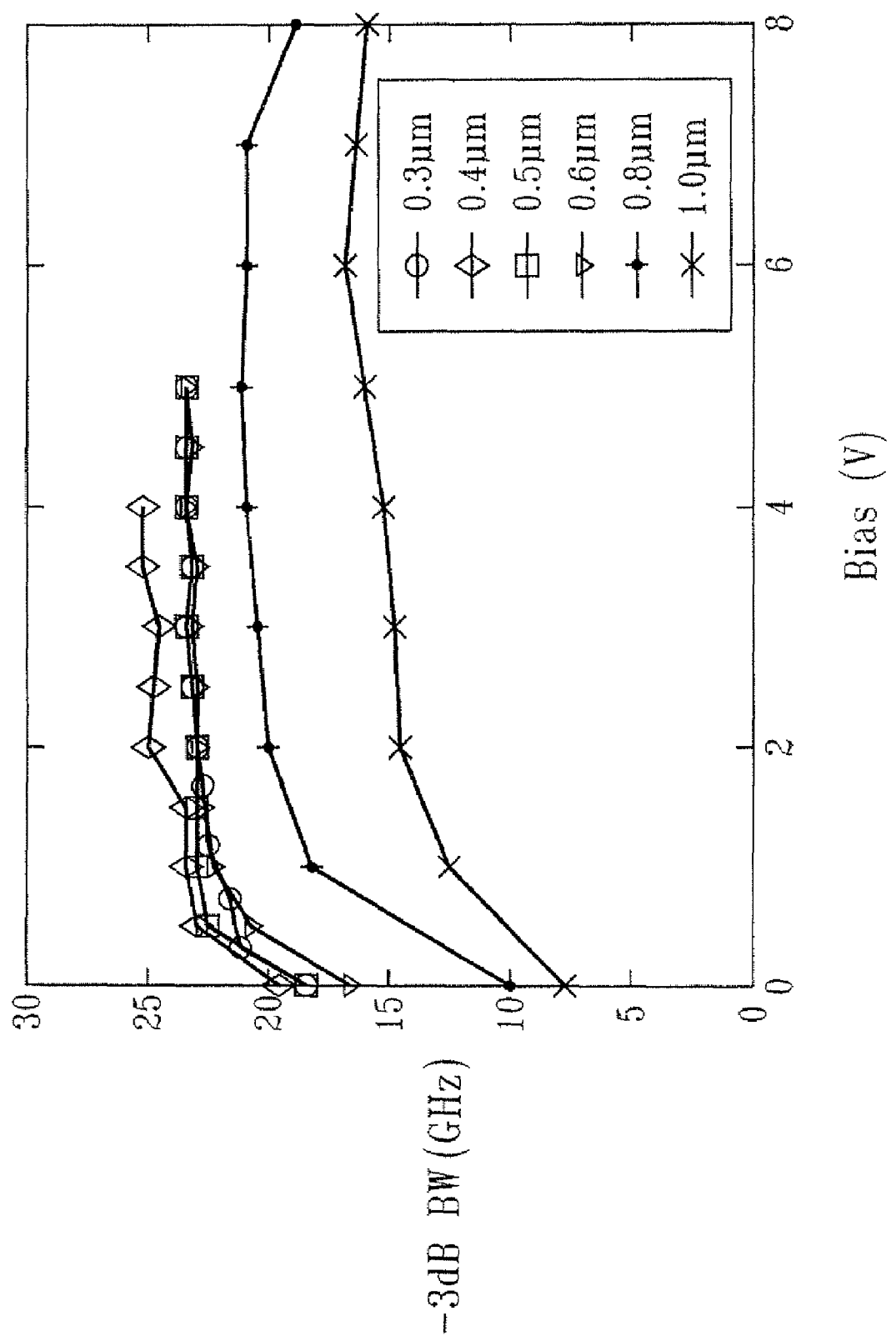
FIG. 3(a) shows the bandwidth vs. bias data.
Figure 3B:
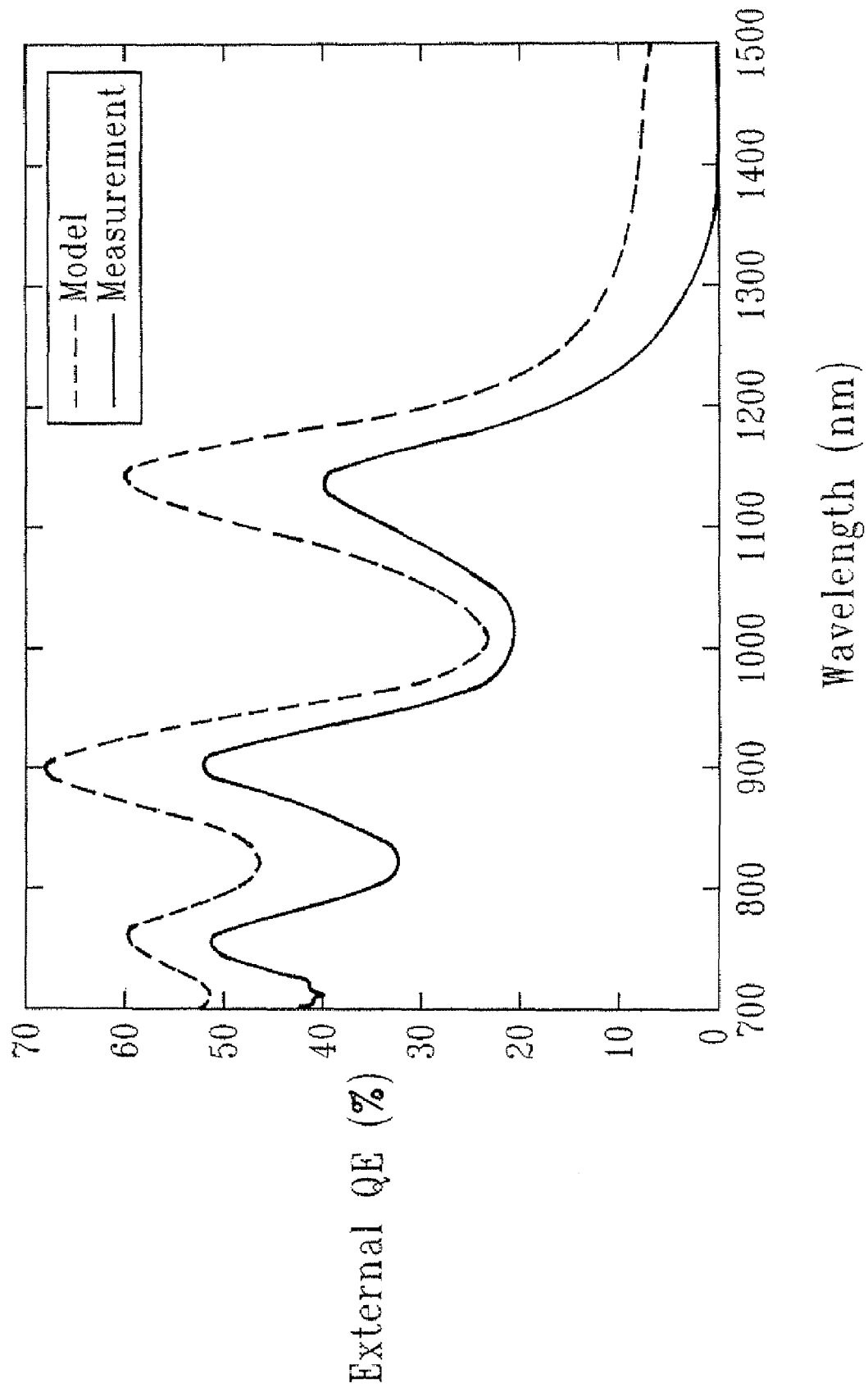
FIG. 3(b) shows the absorption vs. wavelength data.
Figure 3C:
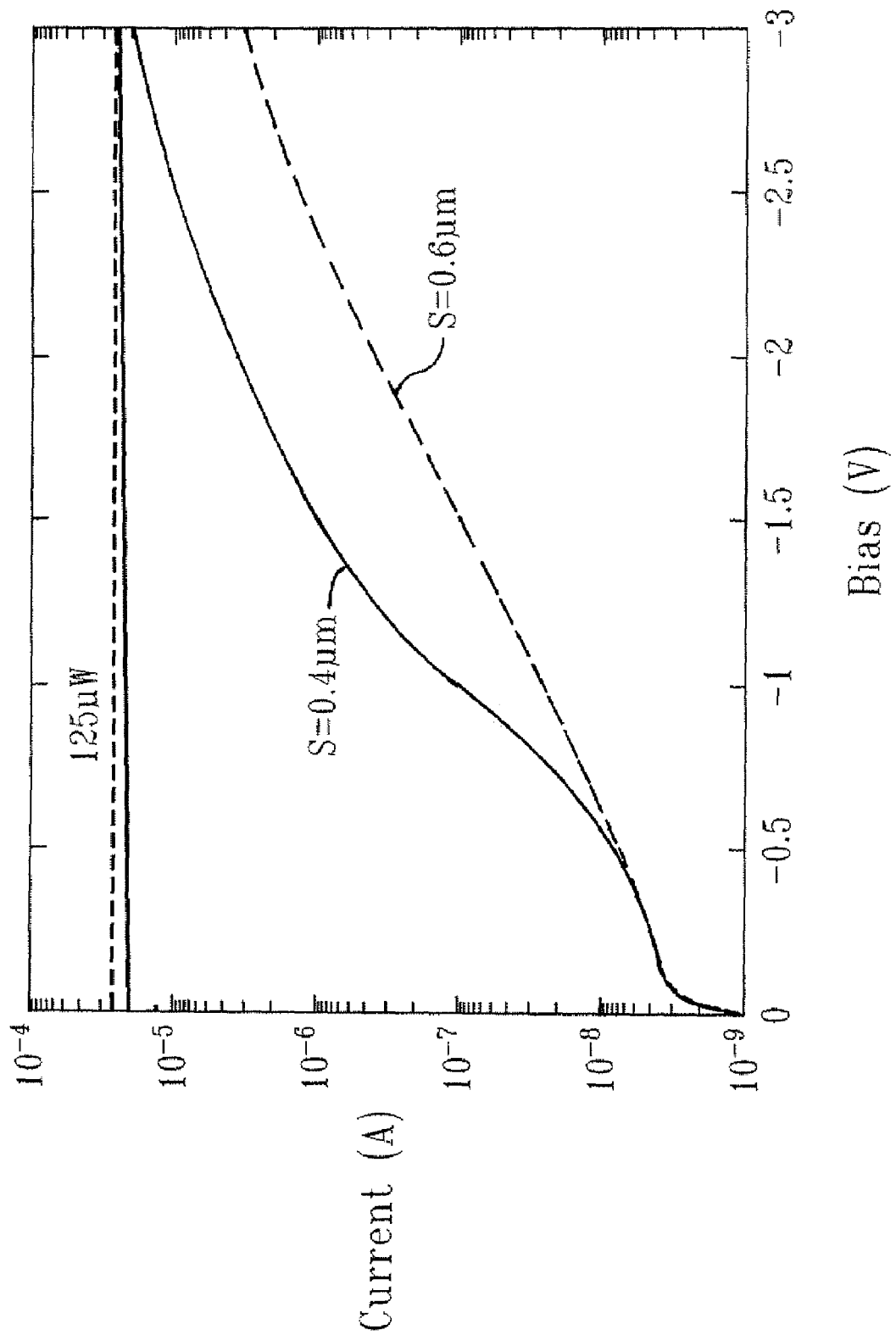
FIG. 3(c) shows the LIV characteristics at $\lambda$=822 nm for a device structure similar to that described in FIG. 2(a).

A photodetector similar to that described in FIG. 2(a) has been fabricated and the results are described in FIGS. 3(a)-3(c). The initial Si layer was about 45 nm thick, and the Ge layer was grown to a total thickness of 400 nm. After growth, the multi-layer structure underwent a thermal cyclic annealing similar to the description given in H. S. Luan, et al., Appl. Phys. Lett, vol. 75, 2909 (1999), where the temperature was ramped ten times between 780° C. and 900° C. and held at each temperature for approximately 6 minutes. The width of the n-type and p-type contact regions was 0.3 µm, while the spacing between the contact regions ranged between 0.3 to 1.3 µm. The contact metal was 30 nm of Ti, with 150 nm of Al to achieve low resistance, and the contacts were contained within the contact boundaries with a clearance of 0.05 µm on either side.

The bias dependence of the −3 dB bandwidth for a devices with $10 \times 10$ µm$^2$ active area for different electrode spacings is shown in FIG. 3(a). The bandwidth was extracted from impulse response measurements performed at a wavelength of 850 nm using a mode-locked Ti-sapphire laser. The bandwidth saturates at extremely-low bias voltages of 1-2 V, depending on the electrode spacing. Even at zero bias, the bandwidth is as high as 20 GHz. The highest bandwidth achieved was a value of 25 GHz for a contact spacing of 0.4 µm.

FIG. 3(b) shows the calculated and measured quantum efficiency vs. wavelength for a $30 \times 30$ µm$^2$ device with finger spacing of 1.3 µm, where the electrode shadowing factor (approximately 0.8) is not accounted for in the calculation. Quantum efficiencies of 38% and 52% were obtained at wavelengths of 850 nm, and 900 nm, respectively. These results demonstrate the benefits of the present invention, where, despite the very high-temperature annealing, quantum efficiency very close to theoretical predictions for pure Ge is obtained, except at very long wavelengths, where even a small amount of interdiffusion can reduce the absorption. The device shows a moderate oscillatory dependence of the response, but because of the strong absorption, particularly, at short wavelengths, precise tuning is not absolutely necessary to achieve acceptable responsivity, in contrast to Si resonant cavity detectors described in J. D. Schaub, et al., IEEE Phot. Tech. Lett. vol. 11, 1647 (1999).

FIG. 3(c) shows the dark current and photocurrent for detectors as described above with S=0.4 µm and 0.6 µm. The plot shows that under normal illumination conditions, light-to-dark current ratios greater than $10^3$ can be obtained. The higher dark current of the S=0.4 µm geometry at high biases is not a problem, since high-speed operation can be obtained in these devices at bias voltages of <1 V, or even zero bias as shown in FIG. 3(a).

Figure 4:
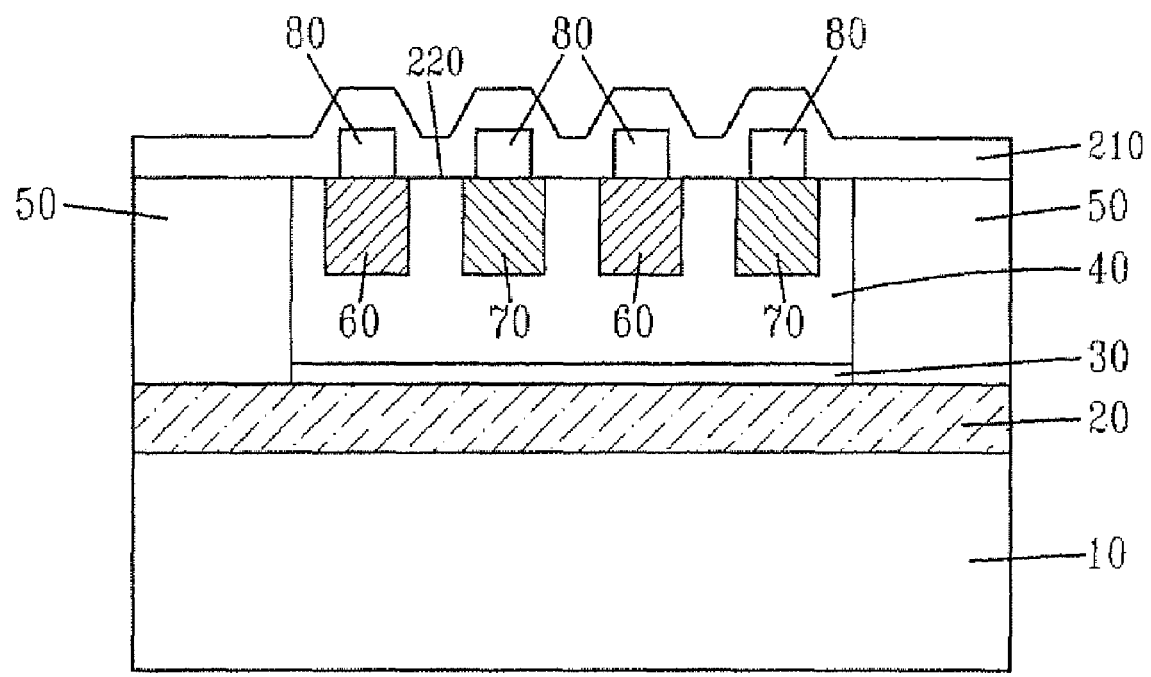
FIG. 4 shows the device structure in FIG. 1(a) additionally including an anti-reflection coating.

The device responsivity could be further improved by additionally including an anti-reflection coating as depicted in FIG. 4. Without an anti-reflection coating, about ⅓ of the light impinging upon the Ge surface is reflected before even entering the absorbing region of the device. By utilizing a transparent dielectric layer 210 located on top of the Ge surface 220, the reflection can be reduced to nearly 0%. Dielectric layer 210 only functions as an anti-reflection layer in the regions between the electrodes, but could be deposited over the entire device, as shown in the drawing, for processing convenience. The dielectric layer 210 ideally should have an index of refraction, $n_{ar}$, that is approximately the square-root of the dielectric constant, $n_4$, of the Ge layer. However, any layer with a dielectric constant between 1 and $n_4$ will provide some degree of benefit. Candidate materials for the anti-reflection coating include, but are not limited to SiO, SiON, SiN, diamond-like carbon (DLC), SiLK (a thermosetting polyarylene polymer supplied by the Dow Chemical Co.) and SiCOH (also referred to as a carbon-doped oxide), and combinations thereof. The structure shown in FIG. 4 also includes substrate 10, insulating layer 20, Si layer 30, Ge layer 40, alternating contact regions 60 and 70, electrodes 80 and isolation regions 50.

Figure 5:
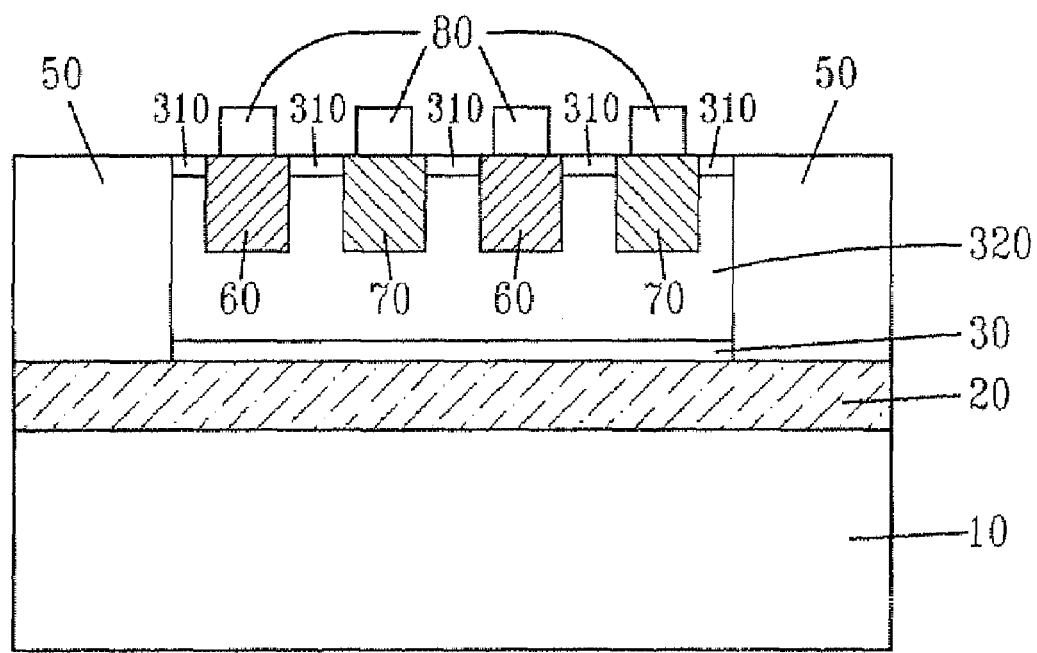
FIG. 5 shows the device structure in FIG. 1(a) additionally including a surface SiGe layer.

Another embodiment of the present invention is shown in FIG. 5, where a thin surface $Si_{1-z}Ge_z$ layer is utilized to improve the dark current. In general, Ge has poor surface passivation properties, and oftentimes the main source of dark current can be leakage along the surface layer between the contacts. By utilizing a thin $Si_{1-z}Ge_z$ surface layer 310, on top of Ge layer 320, a more controllable surface is obtained.

$Si_{1-z}Ge_z$ surface layer 310 could be deposited before or after high-temperature annealing to reduce defects in the Ge layer. Since $Si_{1-z}Ge_z$ surface layer 310 is under tensile strain, it is important that it be thinner than the critical thickness for formation of defects, since defects near to the surface electrodes could be detrimental to the device performance. Depending upon the Ge content, z, the thickness could range from approximately 20 nm for z=0.8 to only a few monolayers for pure Si. The structure shown in FIG. 5 also includes substrate 10, insulating layer 20, Si layer 30, alternating contact regions 60 and 70, electrodes 80 and isolation regions 50.

An additional benefit in the above embodiment could be gained by fabricating the photodiode on a SiGe-on-insulator (SGOI) substrate. This substrate is useful for CMOS applications because the relaxed SiGe acts as a template for growth of strained Si, which can improve the CMOS performance. In these embodiments, the initial Si layer on top of the buried oxide is replaced by a SiGe layer. This embodiment of the present invention helps the photodetector performance, by reducing even further the amount of initial Si available for interdiffusion. The SiGe may also help reduce the dislocation density in the Ge layer, since the lattice constant is closer to that of Ge than pure Si. The reduced dislocation density could improve the dark current by reducing the generation rate of electron-hole pairs.

It should be pointed out that for the embodiments shown in FIG. 4, high-temperature annealing could cause interdiffusion and modify the layer structure profile as shown in FIG. 2(a) or FIG. 2(b). Furthermore, it is understood that high-temperature annealing of the embodiment described in FIG. 5, would result in an additional interdiffused region between layers 310 and 320.

Figure 6:
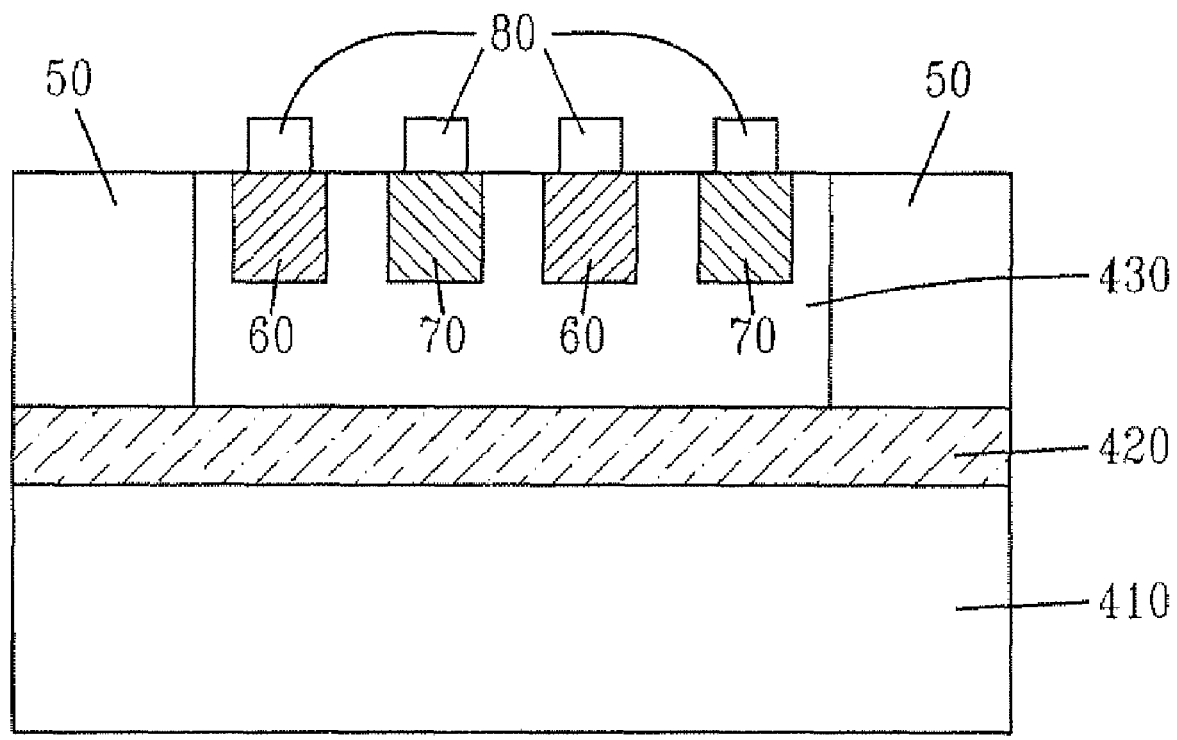
FIG. 6 shows a cross-sectional diagram of another embodiment of the present invention in which a Ge layer is located directly on a buried insulator.

As mentioned previously, it is desirable to keep the initial Si layer above the buried insulator as thin as possible to limit the Si available for interdiffusion. However, in the embodiments shown above, the Si thickness cannot be reduced to zero, because single-crystal Ge cannot be nucleated over $SiO_2$ without using exotic techniques such as lateral overgrowth. However, the present invention also provides a photodetector structure that solves this problem by utilizing a Ge directly on a buried insulator layer as shown in FIG. 6.

One way of achieving a Ge layer directly on a buried insulator, is to utilize a Ge layer on a crystalline insulator (see, for example, S. Guha, et al., Appl. Phys. Lett. vol. 80, 766 (2002)) as shown in FIG. 6. In this embodiment, the multi-layer structure would consists of Si substrate 410, followed by single-crystal insulator layer 430, and Ge layer 430. The structure shown in FIG. 6 also includes alternating contact regions 60 and 70, electrodes 80 and isolation regions 50.

Because insulator layer 420 is crystalline, epitaxial Ge can be grown directly on top of it without the need for an interleaving Si layer. Of course the Ge is still lattice-mismatched to the crystalline insulator 420, and therefore a thick Ge layer will likely still relax via the formation of misfit dislocations at the interface between the Ge layer 430 and the insulator layer 420. However, in perovskite oxides, the (110) crystal plane of the perovskite corresponds to the (100) crystal plane of Si, such that the oxide has a rotated crystalline structure, with a lattice-constant about 2% larger than Si. This can help to accommodate a portion of the 4% lattice mismatch between Si and Ge, thereby leading to higher-quality Ge layers with reduced defect density. The crystalline oxide need only be sufficiently thick to suppress tunneling between the absorption region and the underlying substrate, and therefore a thickness greater than about 5 nm is required. Candidate materials for the crystalline oxide include, but are not limited to $(Ba,Sr)O$, $BaTiO_3$, $SrTiO_3$, $SrRuO_3$, $MgO$, $TiO_2$, and combinations thereof.

Another way of realizing the photodetector structure with a Ge layer on a buried insulator layer is to utilize a bonded Ge-on-insulator substrate (see, for example, A. Reznicek, et al., Spring MRS Meeting, San Francisco, 2004). In this embodiment, the multi-layer structure consists of Si substrate 410, followed by insulator layer 420, and Ge layer 430. In the preferred embodiment, the insulator layer is $SiO_2$ and the original Ge layer is transferred onto the $SiO_2$ layer either by wafer bonding a bulk Ge wafer, or a Ge layer grown on a Si substrate by compositional grading, and then removing the remaining substrate by wafer splitting or selective etching. In either case, this embodiment has the advantage of eliminating the need for the Si underlayer between the Ge and the buried oxide, and also improving the Ge absorbing layer quality.

Figure 7:
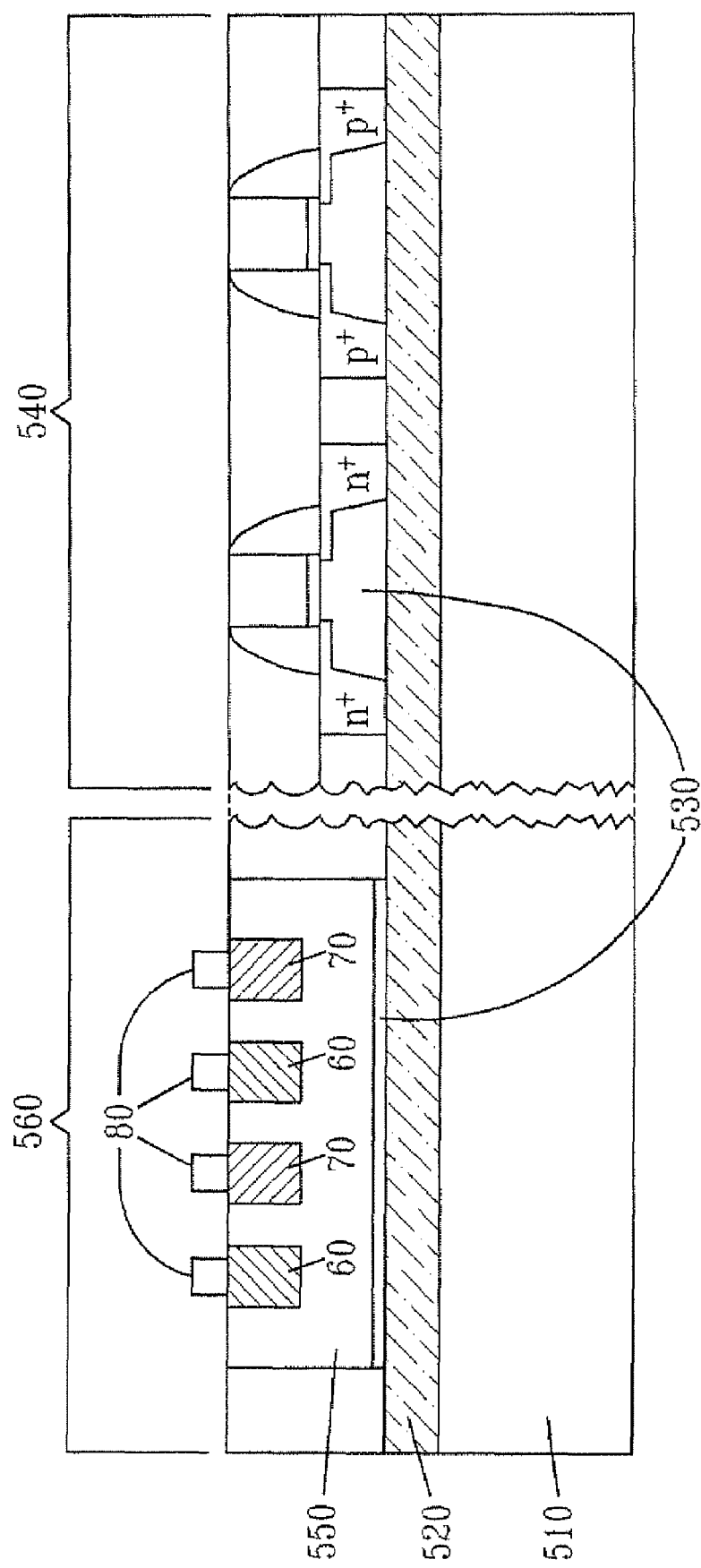
FIG. 7 shows the device structure in FIG. 1(a) combined with a SOI CMOS.

One of the key advantages of the present invention is that it can straightforwardly be integrated with Si CMOS. In particular, FIG. 7 shows how the embodiment described in FIG. 1(a)-1(b) could be combined with SOI CMOS. In this embodiment, the CMOS and the photodetector utilize a common substrate 510 and buried insulator 520. The thin Si layer 530 above the buried insulator acts as the active region for CMOS devices 540, and acts as the underlayer beneath Ge layer 550 of photodetector 560. In the case of fully-depleted SOI, the same thickness of Si can be utilized for the CMOS and the photodetector. Alternatively, if the CMOS is partially-depleted SOI, then thicker Si can be utilized for the CMOS devices, either by regrowing extra Si in the regions of the CMOS devices, or by etching back excess Si in the regions of the photodetector. Since, in the preferred embodiment, the photodetector absorbing region is in the range of 50 nm to 500 nm, the detector can retain reasonable planarity with the CMOS devices, which typically have heights ranging from 200 nm to 250 nm above the buried oxide. The structure shown in FIG. 7 also includes alternating contact regions 60 and 70, electrodes 80 and isolation regions 50 in photodetector region 560.

Figure 8:
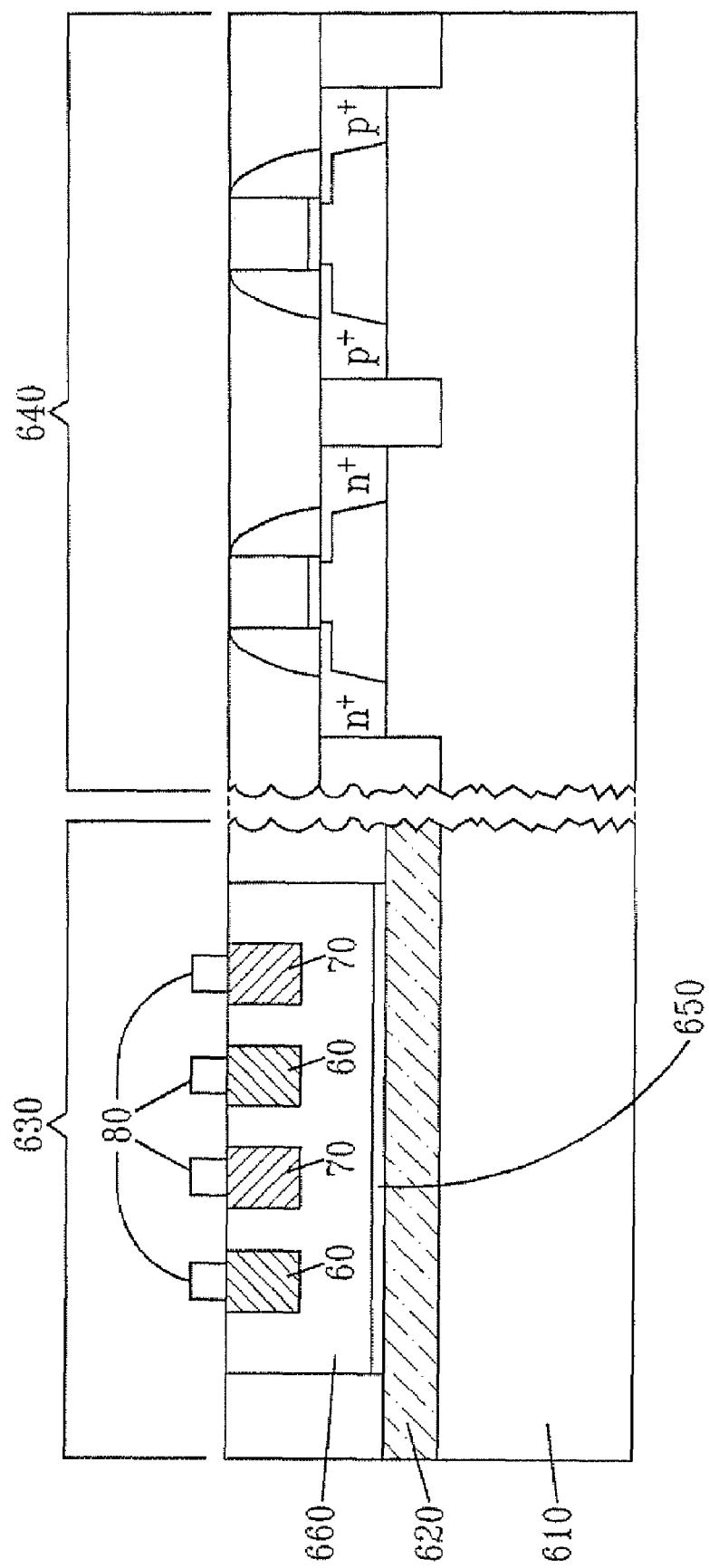
FIG. 8 shows the device structure in FIG. 1(a) combined with a bulk CMOS using selective SOI.

The photodetector could also be combined with bulk Si CMOS as shown in FIG. 8. In this embodiment, both devices share a common substrate 610, but the photodetector utilizes a selective buried insulator 620, that is located in the regions beneath photodetector 630, but not below CMOS devices 640. One possible method of creating the selective buried insulator is the process called separation by implantation of oxygen (SIMOX) wherein oxygen ions are first implanted into a Si substrate to form at least a damaged region, followed by an annealing process. In this case, a buried $SiO_2$ layer is created by implanting oxygen ions and then annealing at very high temperatures. Alternatively, the photodetector could utilize a crystalline insulator, as described in the embodiment of FIG. 6. In this case, the thin Si layer 650 above the buried insulator could be eliminated such that the photodetector active region consists only of Ge. The structure shown in FIG. 8 also includes alternating contact regions 60 and 70, electrodes 80 and isolation regions 50 in photodetector region 630.

In both embodiments shown in FIG. 7 and FIG. 8, it would be desirable for the Ge to be deposited selectively, instead of over the entire wafer. This could be accomplished quite readily, as it is fairly well-known in the art how to deposit Ge selective to SiO or SiN. Selective deposition of the Ge provides flexibility as to when the photodetector is fabricated with respect to the CMOS devices. Selective deposition also has the advantage that defect reduction is more readily achieved in small-area structures, and therefore high-temperature annealing to reduce the dislocation density can be minimized or completely avoided. Photodetectors that utilize the crystalline oxide structure have a particular advantage in this respect.

Figure 9A:
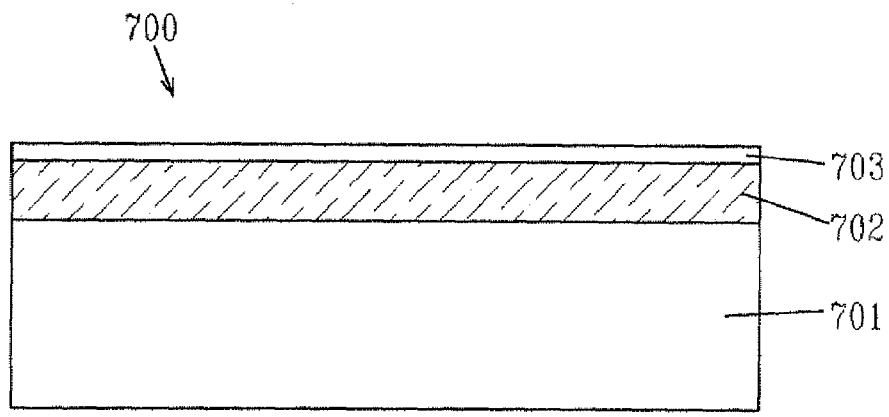
FIGS. 9(a)-9(g) show one method of fabricating the high-speed Ge-on-insulator photodetector structure of the present invention.
Figure 9B:
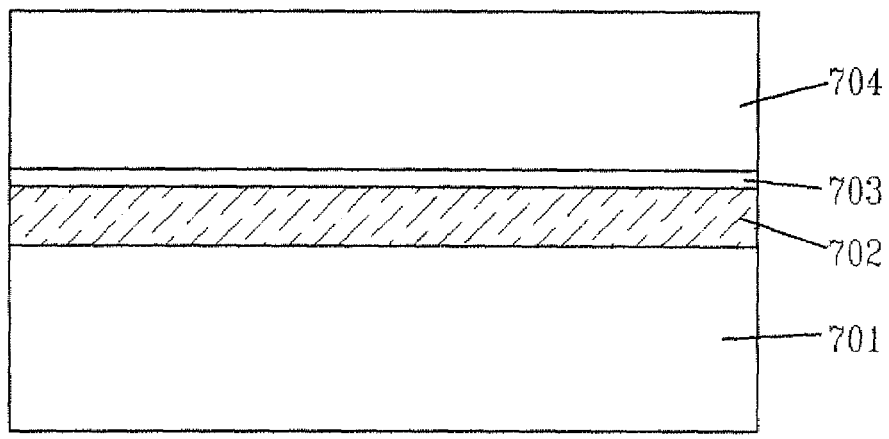
Figure 9C:
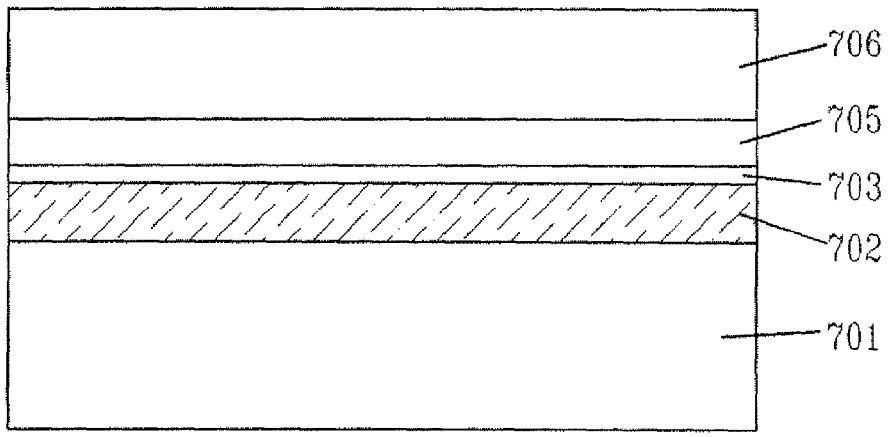

FIGS. 9(a)-9(g) show one method of fabricating the high-speed Ge-on-insulator photodetector structure of the present invention. In this embodiment, the starting material is a thin SOI substrate 700 as shown in FIG. 9(a); substrate 700 includes Si substrate 701, buried insulator 702, and SOI layer 703. Next, a Ge layer 704 is epitaxially-grown directly on top of the SOI layer 703 as shown in FIG. 9(b). Optionally, a thin Si seed layer (5-30 nm) can be grown before the Ge layer 704, in order to improve the quality of the Ge layer. The temperature for the initial Ge growth is kept very low (approximately 300°-350° C.) in order to avoid three-dimensional growth. Then, after growth of this initial Ge layer, the temperature can be raised to grow the remaining portion of the layer. Normally, after growth, the Ge layer will be highly relaxed, but have a high threading dislocation density of approximately $10^9$ cm$^{-2}$. In order to reduce the dislocation density, the material is annealed to provide the structure shown in FIG. 9(c). The annealing can be performed at a uniform temperature, or using cyclic annealing as described in U.S. Pat. No. 6,635, 110, the content of which is incorporated herein by reference. In FIG. 9(c), reference numeral 705 denotes $Si_{1-x}Ge_x$ layer caused by interdiffusion and reference numeral 706 denotes the remaining top Ge layer after interdiffusion.

Figure 9D:
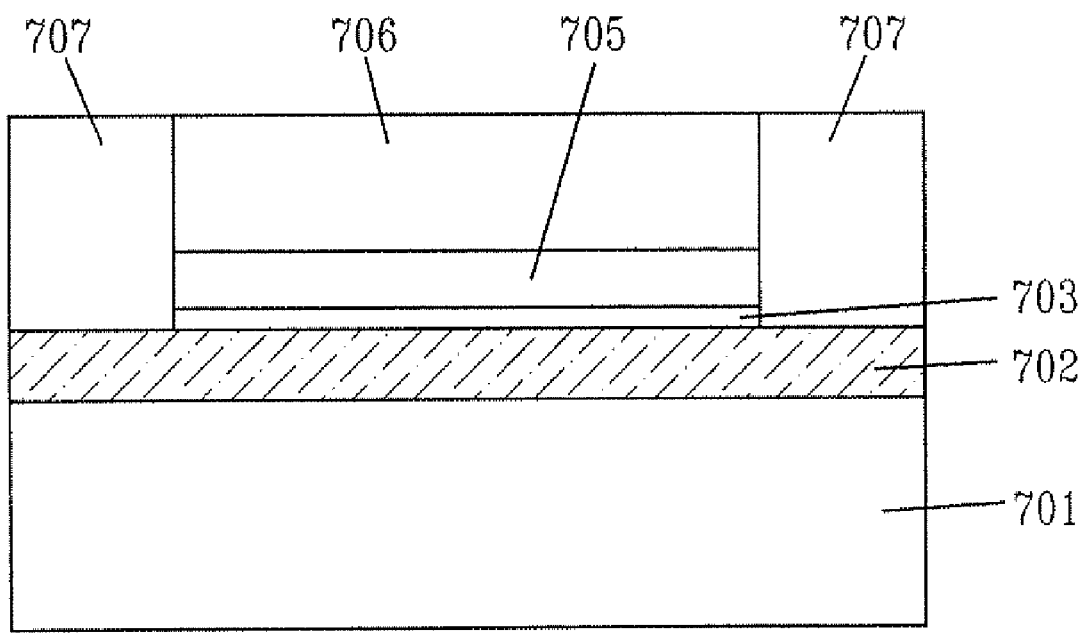

The temperature and times for the annealing will vary depending upon the thickness of the Ge layer, whether or not the layer is grown uniformly or patterned, and whether or not the underlying insulator is an amorphous or crystalline insulator. The annealing is performed to reduce threading dislocations in the resulting multi-layer structure. Typical annealing temperatures are from about 750° to about 900° C. Nevertheless, annealing is generally advantageous to reduce the dislocation density and improve the material quality and therefore, the use of the buried insulator is critical to limit the Si available for interdiffusion. After annealing, isolation regions 707 are formed by etching down to the buried oxide layer and then refilling with an insulating material, as shown in FIG. 9(d). In the figure, the insulating isolation regions 707 are shown to the same height as the Ge active area, but in general, the isolation regions do not need to be the same height as the Ge active area. However, the isolation regions 707 should be sufficiently thick to cover to the highly-defective region near the Si/Ge interface. This ensures that the surface electrodes do not touch the highly-defective regions when they cross the isolation region edge, a situation which could cause excessive device leakage.

Figure 9E:
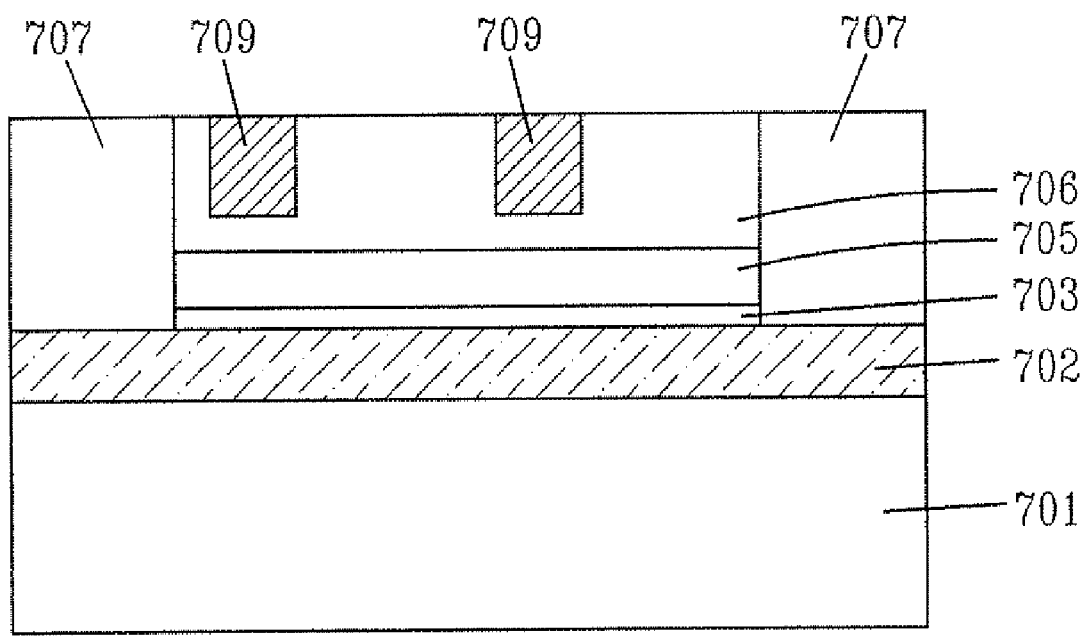
Figure 9F:
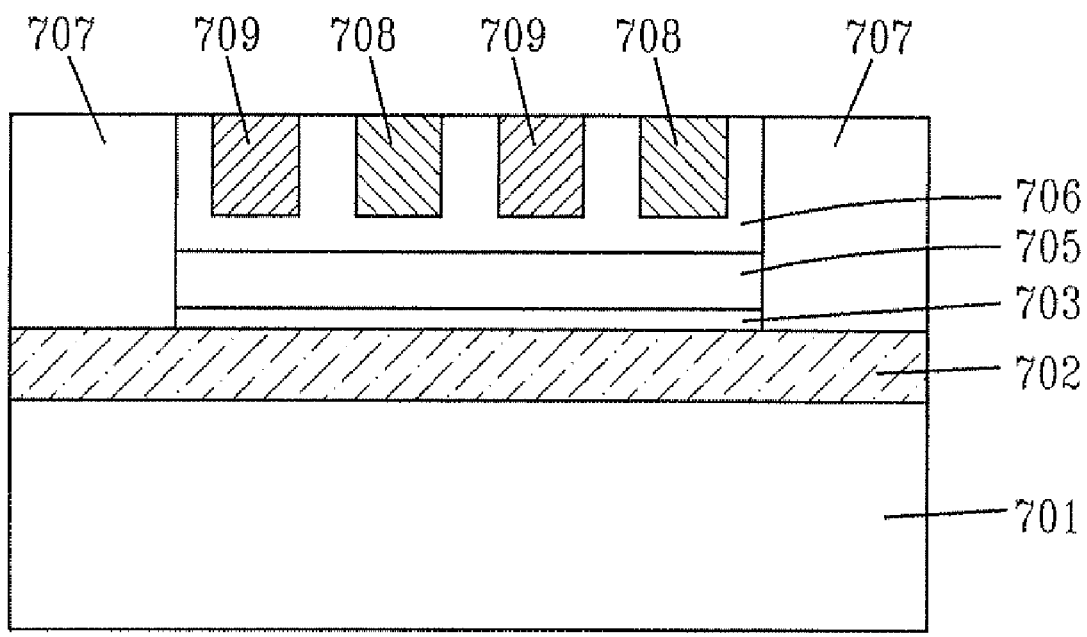

Next, alternating p-type and n-type contacts, 709 and 708, respectively are formed as shown in FIGS. 9(e) and 9(f). The p-type implants are shown to be formed first, followed by the n-type implants, however the order of the implants could be reversed. In the preferred embodiment, the contacts are formed by ion implantation using a resist or dielectric mask. After implantation of each species, the contacts are annealed in order to activate the implants. Alternatively, both sets of contacts can be implanted and then annealed at the same time.

For the n-type contacts, the preferred dopant species are As, P or Sb, while for the p-type contacts, the preferred dopant species is B. The implant depth should be kept sufficiently low so that the dopant species remain far from the defective layer near the bottom of the Ge layer. Therefore, in the preferred embodiment, the peak as-implanted dopant concentration for both the n-type and p-type contacts should be only about 5-30 nm from the surface.

Figure 9G:
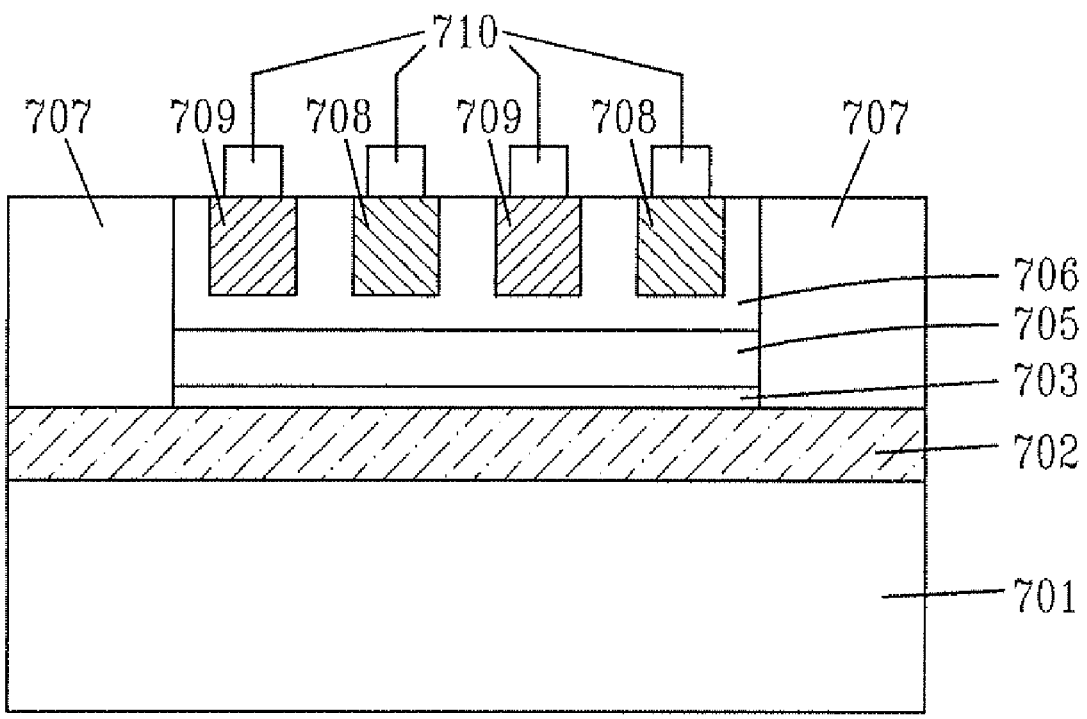

The conducting electrodes 710 are then formed as shown in FIG. 9(g). The electrodes could be fabricated by a number of means, including, but not limited to evaporation, sputtering, or chemical vapor deposition. The electrode patterning can also be performed by a number of techniques such as lift-off, deposition and etching or chem-mechanical polishing. The electrode resistance should be sufficiently low so that the device performance is not limited by RC delay, and therefore the optimal thickness and width of the fingers is a function of the device area (which affects the capacitance) and the resistivity of the finger material. For instance, for a 10×10 μm$^2$ active area, the capacitance is typically 50 fF. Therefore, in order to achieve a bandwidth of 30 GHz, the electrode resistance should be less than about 100 Ω. For Al fingers with a width of 200 nm, this corresponds to a thickness range of approximately 150 to 300 nm. For square device geometries, because the capacitance scales with device area, while the electrode resistance remains constant, it is desirable to keep the device area as small as possible without disrupting the ability to effectively collect the incident light. The device area should also be no larger than needed to couple the light into the active area of the device in order to maximize the light-to-dark current ratio. Given these conditions, device areas in the range of 100 μm$^2$ and 1000 μm$^2$ are preferred.

Another requirement of the electrode material is that it should make good Ohmic contact to both n-type and p-type Ge. However, given the narrow band gap of Ge; this is generally not a problem, and sufficient Ohmic contact can be made with nearly any metal. Candidate metals for the electrodes include, but are not limited to Al, Cu, Ti, TiN, Pt, W, Ta, TaN, Pt, Pd, Hf, ITO and combinations thereof. Silicides and germanides of the aforementioned metals are also contemplated herein.

The process illustrated in FIGS. 9(a)-9(g) could also include the deposition of an anti-reflection coating. The anti-reflection coating could be deposited after the electrode formation as shown in FIG. 4, or earlier in the process. A surface SiGe layer described in FIG. 5 could also be grown either immediately after the Ge layer growth, or preferably after completion of the cyclic annealing. This latter situation would prevent the formation of dislocations near the sample surface, where they could have a greater negative affect on the device performance. The surface SiGe layer could also be selectively deposited after formation of the isolation layers, with the advantage that it would cover any of the remaining exposed sidewalls, thus reducing the chance of sidewall induced leakage. Advantageously, the entire Ge layer could be grown after formation of the isolation regions. This embodiment has the advantage that the Ge layer would only be grown in a small area, and thus defect reduction during growth and subsequent annealing should be facilitated. However, care must be taken in this embodiment to ensure that the lower sidewalls are not exposed after growth to prevent leakage from the electrodes touching this highly-defective region.

While the invention has been particularly shown and described with respect to illustrative and preferred embodiments thereof, it will be understood by those skilled in the art that the foregoing and other changes in form and details may be made therein without departing from the spirit and scope of the invention. Thus, the present invention should be limited only by the scope of the appended claims.

What is claimed is:

1. A method of fabricating a semiconductor photodetector, the method comprising the steps:

forming a semiconductor structure comprising a single-crystal semiconductor substrate; a second layer of an insulating material, and a third layer comprising essentially Si;

growing epitaxially a fourth layer of essentially Ge, the fourth layer having a surface layer;

annealing to reduce threading dislocation density;

forming isolation regions surrounding said third layer and said fourth layer, said isolation regions having a top border adjacent to or above said fourth layer and a bottom border adjacent to said second layer;

forming alternating stripes of p-type and n-type doped material adjacent to said surface layer such that regions of non-intentionally-doped material remain between said alternating stripes; and forming a set of electrodes on said surface layer comprising a plurality of interdigitated members, wherein the entirety of the portion of said electrodes that is in contact with said surface layer also is in contact with said stripes of p-type and n-type doped material.

2. The method of claim 1, wherein said fourth layer has a thickness greater than 50 nm, and the combined thickness of said third layer and said fourth layer is less than 500 nm.

3. The method of claim 1, wherein the combined average Ge concentration of said third layer and said fourth layer is greater than 80%.

4. The method of claim 1, further comprising forming a Si seed layer before the growth of said fourth layer of Ge.

5. The method of claim 1, wherein said stripes of p-type and n-type doped material are formed by ion implantation and subsequent annealing.

6. The method of claim 1, further comprising the deposition a transparent dielectric material on top of the portions of said surface layer not in direct contact with said electrodes and having a refractive index between 1 and that of said fourth layer so as to act as an anti-reflection coating.

7. The method of claim 1, wherein the annealing is performed at a temperature in the range between 750° C. and 900° C.

8. The method of claim 1, wherein the annealing forms an additional layer of $Si_{1-x}Ge_x$ between said third layer of Si and said fourth layer of Ge, as a result of interdiffusion.

9. The method of claim 1, wherein said third layer of Si and said fourth layer of Ge interdiffuse during the annealing to form a layer of $Si_{1-x}Ge_x$ with a Ge concentration, x, that varies continuously from a minimum value adjacent to said second layer to a maximum value at said surface layer.

10. A method of fabricating a semiconductor photodetector, the method comprising the steps:

forming a semiconductor structure comprising a single-crystal semiconductor substrate; a second layer of an insulating material, and a third layer comprising essentially Si;

growing epitaxially a fourth layer of essentially Ge;

growing epitaxially a fifth layer of essentially $Si_{1-z}Ge_z$, the fifth layer having a surface layer;

annealing to reduce threading dislocation density;

forming isolation regions surrounding said third layer and said fourth layer and said fifth layer, said isolation regions having a top border adjacent to or above said fourth layer and a bottom border adjacent to said second layer;

forming alternating stripes of p-type and n-type doped material adjacent to said surface layer such that regions of non-intentionally-doped material remain between said alternating stripes; and forming a set of electrodes on said surface layer comprising a plurality of interdigitated members, wherein the entirety of the portion of said electrodes that is in contact with said surface layer also is in contact with said n-type or said p-type doped material.

11. The method of claim 10, wherein said fifth layer of essentially $Si_{1-z}Ge_z$ is grown after the annealing, but before the forming of the isolation regions.

12. The method of claim 10, wherein said fifth layer of essentially $Si_{1-z}Ge_z$ is grown after step forming of the isolation regions, but before forming the alternating stripes of p-type and n-type doped material.

13. A method of fabricating a semiconductor photodetector, the method comprising the following steps:

forming a semiconductor structure comprising a single-crystal semiconductor;

growing epitaxially a second layer of a crystalline insulating material;

growing epitaxially a third layer of essentially Ge, the third layer having a surface layer;

annealing to reduce threading dislocation density;

forming isolation regions surrounding said third layer, said isolation regions having a top border adjacent to or above said third layer and a bottom border adjacent to said second layer;

forming alternating stripes of p-type and n-type doped material adjacent to said surface layer such that regions of non-intentionally-doped material remain between said alternating stripes; and forming a set of electrodes on said surface layer comprising a plurality of interdigitated members, wherein the entirety of the portion of said electrodes that is in contact with said surface layer also is in contact with said n-type or said p-type doped material.

14. The method of claim 13, wherein said second layer comprises $(Ba,Sr)O$, $BaTiO_3$, $SrTiO_3$, $SrRuO_3$, $MgO$, $TiO_2$, or combinations thereof.

* * * * *